United States Patent
Na et al.

(10) Patent No.: US 10,811,107 B2
(45) Date of Patent: Oct. 20, 2020

(54) SEMICONDUCTOR MEMORY DEVICE AND MEMORY SYSTEM HAVING THE SAME

(71) Applicant: Samsung Electronics Co., Ltd., Suwon-si, Gyeonggi-do (KR)

(72) Inventors: Young Ho Na, Hwaseong-si (KR); Young Sun Min, Hwaseong-si (KR); Dae Seok Byeon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/531,926

(22) Filed: Aug. 5, 2019

(65) Prior Publication Data

US 2020/0273528 A1    Aug. 27, 2020

(30) Foreign Application Priority Data

Feb. 22, 2019  (KR) .................. 10-2019-0020933

(51) Int. Cl.
| | | |
|---|---|---|
| *G11C 16/30* | (2006.01) | |
| *G11C 5/14* | (2006.01) | |
| *G11C 16/04* | (2006.01) | |
| *H03F 3/45* | (2006.01) | |
| *G11C 16/08* | (2006.01) | |

(52) U.S. Cl.
CPC .............. *G11C 16/30* (2013.01); *G11C 5/14* (2013.01); *G11C 5/147* (2013.01); *G11C 16/0483* (2013.01); *G11C 16/08* (2013.01); *H03F 3/45183* (2013.01); *H03F 2200/471* (2013.01); *H03F 2203/45344* (2013.01)

(58) Field of Classification Search
CPC ............ G11C 5/14; G11C 5/147; G11C 16/30
USPC ......................................................... 365/226
See application file for complete search history.

(56) References Cited

U.S. PATENT DOCUMENTS

| | | | |
|---|---|---|---|
| 6,351,178 B1 * | 2/2002 | Ooishi ................. | G11C 5/143 327/541 |
| 6,498,469 B2 | 12/2002 | Kobayashi | |
| 6,850,098 B2 | 2/2005 | Lee et al. | |

(Continued)

FOREIGN PATENT DOCUMENTS

| | | |
|---|---|---|
| JP | 2011108349 A | 6/2011 |
| JP | 2011141759 A | 7/2011 |

(Continued)

*Primary Examiner* — Son L Mai
(74) *Attorney, Agent, or Firm* — Harness, Dickey & Pierce, P.L.C.

(57) ABSTRACT

Provided are a semiconductor memory device and a memory system including the same. The semiconductor memory device includes an external power supply voltage terminal configured to receive an external power supply voltage, an external ground voltage terminal configured to receive an external ground voltage, a ground voltage noise detector configured to detect a difference between the external ground voltage and an internal ground voltage of an internal ground voltage node and generate a ground voltage noise reference voltage, an internal power supply voltage reference voltage generator configured to generate an internal power supply voltage reference voltage based on the external power supply voltage and the ground voltage noise reference voltage, and an internal power supply voltage driver configured to generate an internal power supply voltage based on the internal power supply voltage reference voltage.

19 Claims, 8 Drawing Sheets

(56) References Cited

U.S. PATENT DOCUMENTS

| | | |
|---|---|---|
| 7,248,192 B2 | 7/2007 | Gillespie et al. |
| 7,764,547 B2 | 7/2010 | Lee et al. |
| 7,885,118 B2 | 2/2011 | Nam et al. |
| 7,928,759 B2 * | 4/2011 | Hidaka .................. G11C 5/147 326/33 |
| 2018/0122485 A1 | 5/2018 | Park et al. |

FOREIGN PATENT DOCUMENTS

| | | |
|---|---|---|
| KR | 100545709 B1 | 1/2006 |
| KR | 100623335 B1 | 9/2006 |
| KR | 2006-0127315 A | 12/2006 |

* cited by examiner

SEMICONDUCTOR MEMORY DEVICE AND MEMORY SYSTEM HAVING THE SAME

CROSS-REFERENCE TO RELATED APPLICATION

This application claims from Korean Patent Application No. 10-2019-0020933, filed on Feb. 22, 2019, the disclosure of which is incorporated herein by reference in its entirety.

BACKGROUND

1. Field

Devices and systems consistent with some example embodiments relate to semiconductor memory devices and memory systems including the same.

2. Description of Related Art

A memory system may include a semiconductor memory device and a memory controller. The semiconductor memory device may include an internal power supply voltage generator configured to generate an internal power supply voltage an external power supply voltage and a ground voltage, which are applied from the outside. When a large amount of current is used during an operation of the semiconductor memory device, a large amount of current may flow through an internal power supply voltage driver. Thus, a voltage level of an internal ground voltage node may differ with respect to a level of an external ground voltage but may be elevated, which may result in ground voltage noise. As the voltage level of the internal ground voltage node is elevated, a margin between the internal power supply voltage and an internal ground voltage is reduced, which may adversely affect some operations of the semiconductor memory device.

SUMMARY

Some example embodiments of some inventive concepts include semiconductor memory devices, which may be configured to compensate for a margin between an internal power supply voltage due to ground voltage noise and an internal ground voltage, and memory systems including the semiconductor memory device.

It should be noted that the present disclosure is limited neither by the objects of some inventive concepts and/or the described example embodiments, and some objects of some inventive concepts and/or additional example embodiments will be apparent to those skilled in the art from the following descriptions.

According to some example embodiments, a semiconductor memory device may include an external power supply voltage terminal configured to receive an external power supply voltage, an external ground voltage terminal configured to receive an external ground voltage, a ground voltage noise detector configured to detect a difference between the external ground voltage and an internal ground voltage of an internal ground voltage node and generate a ground voltage noise reference voltage, an internal power supply voltage reference voltage generator configured to generate an internal power supply voltage reference voltage based on the external power supply voltage and the ground voltage noise reference voltage, and an internal power supply voltage driver configured to generate an internal power supply voltage based on the internal power supply voltage reference voltage.

According to some example embodiments, a semiconductor memory device may include a number of planes, an internal ground voltage node in a corresponding peripheral circuit region of each of the planes, an external power supply voltage terminal in a global peripheral circuit region adjacent to peripheral circuit regions of the planes and configured to receive an external power supply voltage, an external ground voltage terminal in the global peripheral circuit region and configured to receive an external ground voltage, a ground voltage noise detector adjacent to the external ground voltage terminal of the global peripheral circuit region and configured to detect a difference between the external ground voltage and an internal ground voltage of a corresponding internal ground voltage node of each of the planes and generate a corresponding ground voltage noise reference voltage, a global reference voltage generator adjacent to the external power supply voltage terminal of the global peripheral circuit region and configured to generate a global reference voltage based on the external power supply voltage, a local reference voltage generator in the corresponding peripheral circuit region of each of the planes and configured to generate a local reference voltage based on the global reference voltage and the corresponding ground voltage noise reference voltage, and a number of internal power supply voltage drivers in the corresponding peripheral circuit region of each of the planes and configured to generate a corresponding internal power supply voltage based on a corresponding local reference voltage.

According to some example embodiments, a memory system may include a semiconductor memory device including a number of planes, and a memory controller configured to respectively apply the same control signal and/or different control signals to the number of planes and transmit an address or a command to the number of planes based on (e.g., in response to) the control signals or transmit and receive data to and from the number of planes based on (e.g., in response to) the control signals. The semiconductor memory device includes the number of planes, an internal ground voltage node in a corresponding peripheral circuit region of each of the planes, an external power supply voltage terminal in a global peripheral circuit region adjacent to peripheral circuit regions of the planes and configured to receive an external power supply voltage, an external ground voltage terminal in the global peripheral circuit region and configured to receive an external ground voltage, a ground voltage noise detector adjacent to the external ground voltage terminal of the global peripheral circuit region and configured to detect a difference between the external ground voltage and an internal ground voltage of a corresponding internal ground voltage node of each of the planes and generate a corresponding ground voltage noise reference voltage, a global reference voltage generator adjacent to the external power supply voltage terminal of the global peripheral circuit region and configured to generate a global reference voltage based on the external power supply voltage, a local reference voltage generator in the corresponding peripheral circuit region of each of the planes and configured to generate a local reference voltage based on the global reference voltage and the corresponding ground voltage noise reference voltage, and a number of internal power supply voltage drivers in the corresponding peripheral circuit region of each of the planes and configured to generate a corresponding internal power supply voltage based on the corresponding local reference voltage.

DETAILED DESCRIPTION OF EXAMPLE EMBODIMENTS

Hereinafter, a semiconductor memory device and a memory system including the same according to some example embodiments of some inventive concepts will be described with reference to the accompanying drawings in which some example embodiments are shown.

Figure 4:
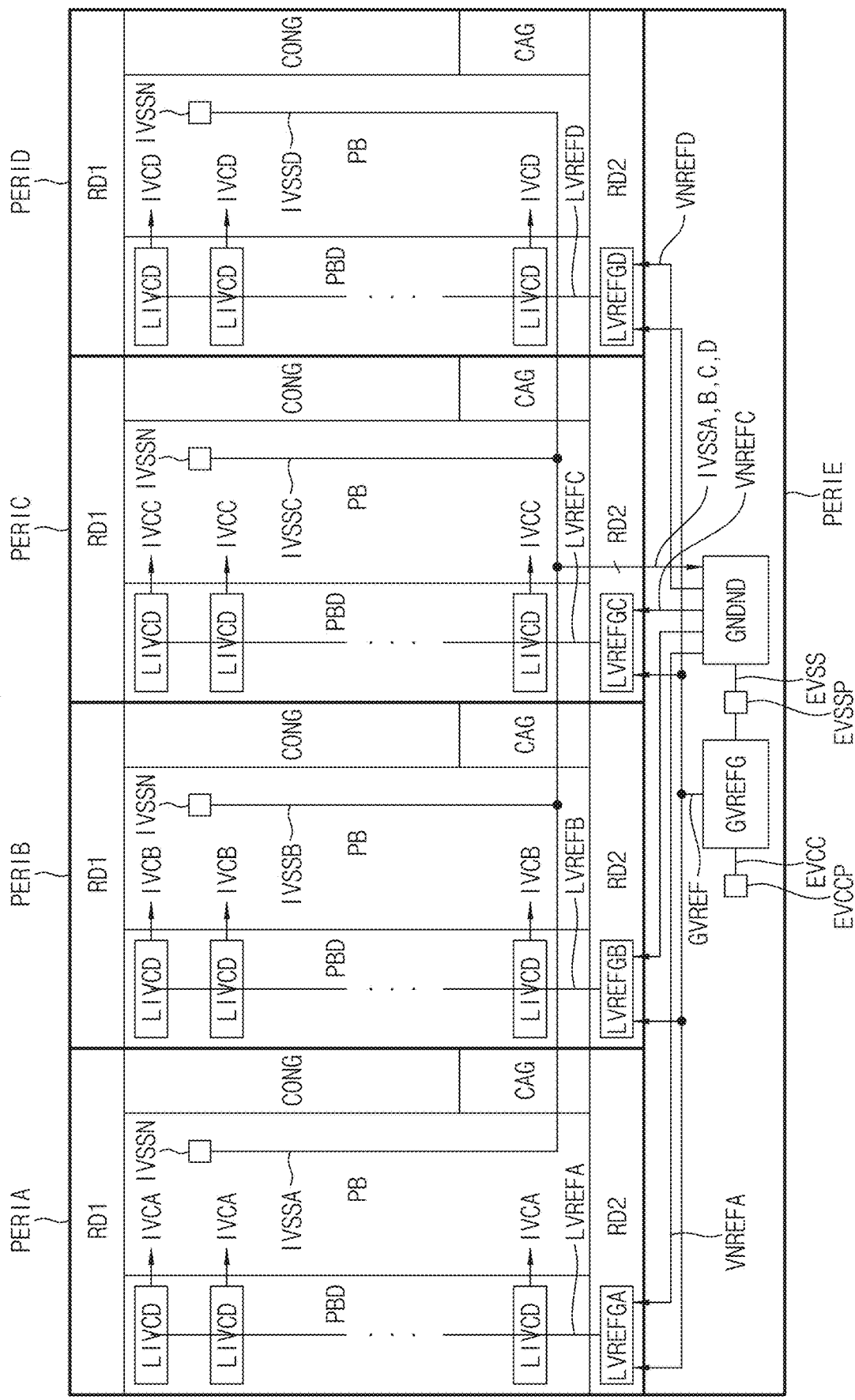
FIG. 4 is a diagram showing an example arrangement of a first semiconductor layer 12 according to some example embodiments of some inventive concepts.

In some example embodiments (such as shown in FIG. 4), a semiconductor memory device may be connected to an external power supply voltage (EVCC), from which a global reference voltage (GVREF) is generated, and an ground voltage (EVSS), from which an internal ground voltage (IVSS) is generated. The semiconductor memory device may include a set of peripheral circuit regions (PERIA, PERIB, etc.) to which the global reference voltage (GVREF) and internal ground voltage (IVSS) are applied. A difference between the ground reference voltage (GVREF) and the internal ground voltage (IVSS) is an internal power supply voltage margin (ΔIVC), which may affect electrical properties of the components of the peripheral circuit region, such as current drawn through a transistor or charge stored by a capacitor.

Figure 5:
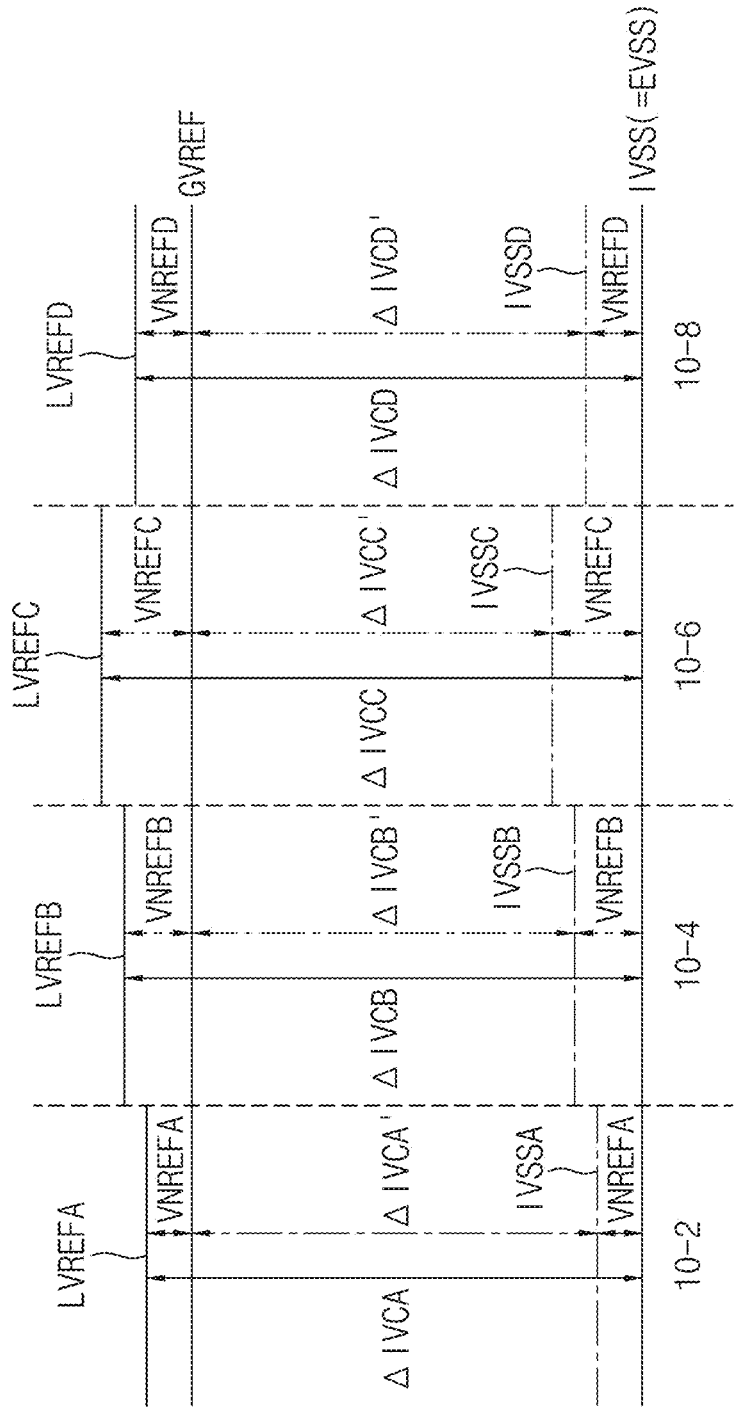
FIG. 5 is a diagram for explaining variations in local reference voltages according to variations in internal ground voltages according to some example embodiments of some inventive concepts.

In some circumstances, the internal ground voltage applied to each peripheral circuit region may vary. For example, variance in the distance between the peripheral circuit region and a ground voltage reference generator and/or variance in current drawn by each peripheral circuit region due to the performance of different operations may affect the internal ground voltage that is being applied to each peripheral circuit region. As shown in FIG. 5, variance in the internal ground voltage may cause a peripheral circuit region to receive an internal power supply voltage margin that is different than other peripheral circuit regions (ΔIVCA, ΔIVCB, etc.) Variance in such internal power supply voltage margins may result in undesirable variance in the electrical characteristics and/or performance of the different peripheral circuit regions.

In some example embodiments, differences in internal power supply margins as a result of internal ground voltage variance may be prevented or reduced. For example, in FIG. 4, ground noise detector (GNDND) may be configured to receive the internal ground voltages (IVSSA, IVSSB, etc.) of the respective peripheral circuit regions and to generate ground voltage noise reference voltages (VNREFA, VNREFB, etc.) As shown in FIG. 5, each peripheral circuit region may add the ground voltage noise reference voltage (VNREFA, VNREFB, etc.,) to the global reference voltage (GVREF) to generate a local reference voltage (LVREFA, LVREFB, etc.) for the peripheral circuit region, wherein the difference between the local reference voltage (LVREFA, LVREFB, etc.) and the internal ground voltage (IVSSA, IVSSB, etc.) is an adjusted internal power supply voltage margin (ΔIVCA', ΔIVCB', etc.) Such configurations may promote consistency, between peripheral circuit regions, of the sum of the adjusted internal power supply voltage margin and the ground voltage noise reference voltage for each peripheral circuit region (e.g., ΔIVCA'+VNREFA), which is also shown in FIG. 5 as a difference between the local reference voltage and the internal ground voltage for the peripheral circuit region (e.g., LVREFA−IVSSA). Such consistency may in turn promote consistent electrical characteristics and/or performance of peripheral circuit regions and/or reduced effects of variance in the internal ground voltages (IVSSA, IVSSB, etc.) of each peripheral circuit region.

Figure 1:
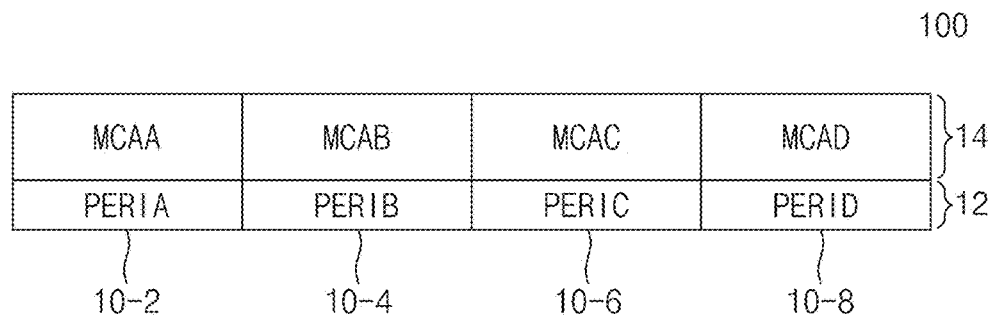
FIG. 1 is a diagram showing an example vertical sectional arrangement of a semiconductor memory device 100 according to some example embodiments of some inventive concept.

FIG. 1 is a diagram showing an example vertical sectional arrangement of a semiconductor memory device 100 according to some example embodiments of some inventive concepts. The semiconductor memory device 100 may include four planes 10-2, 10-4, 10-6, and 10-8, which are arranged in a lateral direction, and a first semiconductor layer 12 and a second semiconductor layer 14, which are stacked in a vertical direction. Each of the four planes 10-2, 10-4, 10-6, and 10-8 may include a corresponding peripheral circuit region PERIA, PERIB, PERIC, or PERID, which is in the first semiconductor layer 12, and a corresponding memory cell array region MCAA, MCAB, MCAC, or MCAD, which is in the second semiconductor layer 14. Each of the four planes 10-2, 10-4, 10-6, and 10-8 may include the corresponding memory cell array region MCAA, MCAB, MCAC, or MCAD on the corresponding peripheral circuit region PERIA, PERIB, PERIC, or PERID. A peripheral circuit of the corresponding plane 10-2, 10-4, 10-6, or 10-8 may be in the corresponding peripheral circuit region PERIA, PERIB, PERIC, or PERID, and a memory cell array of the corresponding plane 10-2, 10-4, 10-6, or 10-8 may be in the corresponding memory cell array region MCAA, MCAB, MCAC, or MCAD.

The semiconductor memory device 100 shown in FIG. 1 may indicate the arrangement of a vertical section of a flash memory.

Figure 2:
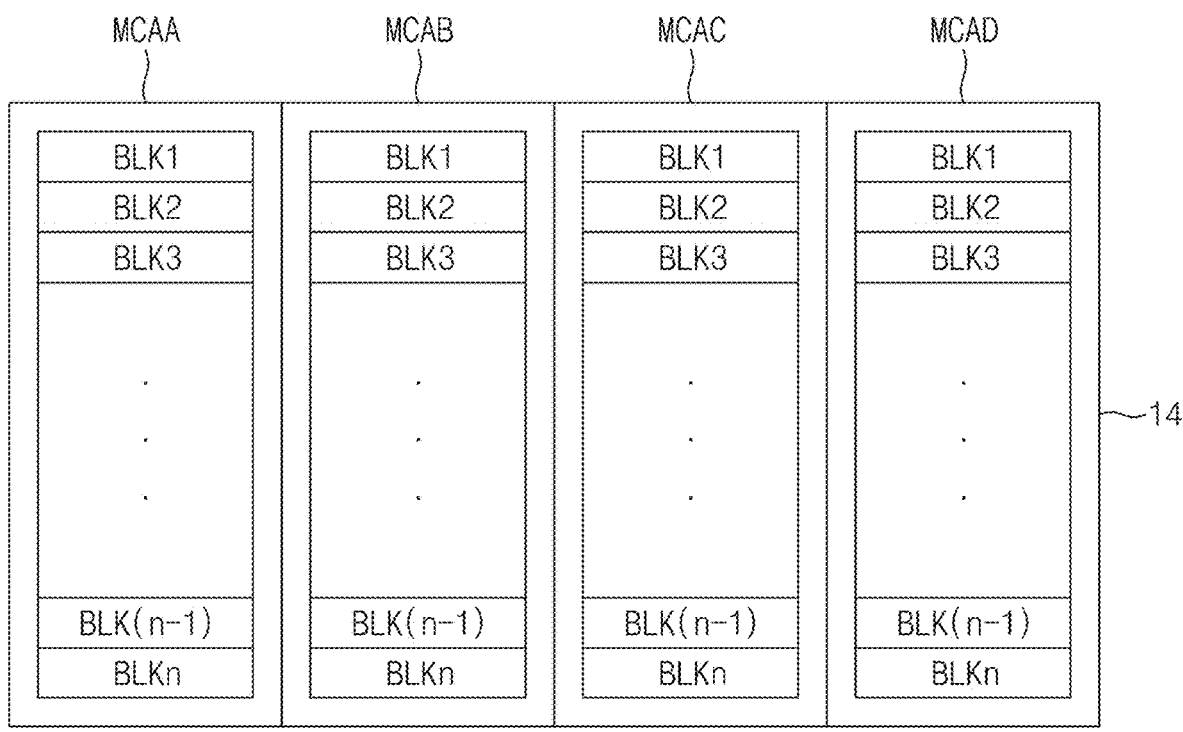
FIG. 2 is a block diagram of an example memory cell array arranged in each of memory cell array regions according to some example embodiments of some inventive concepts.

FIG. 2 is a block diagram of an example memory cell array arranged in each of memory cell array regions MCAA, MCAB, MCAC, and MCAD according to some example embodiments of some inventive concepts. A memory cell array including n blocks BLK1 to BLKn may be in each of the memory cell array regions MCAA, MCAB, MCAC, and MCAD.

Referring to FIG. 2, each of the n blocks BLK1 to BLKn may include x pages, each of which may include y words. For example, n may be 2048, x may be 64, and y may be 1024.

Figure 3:
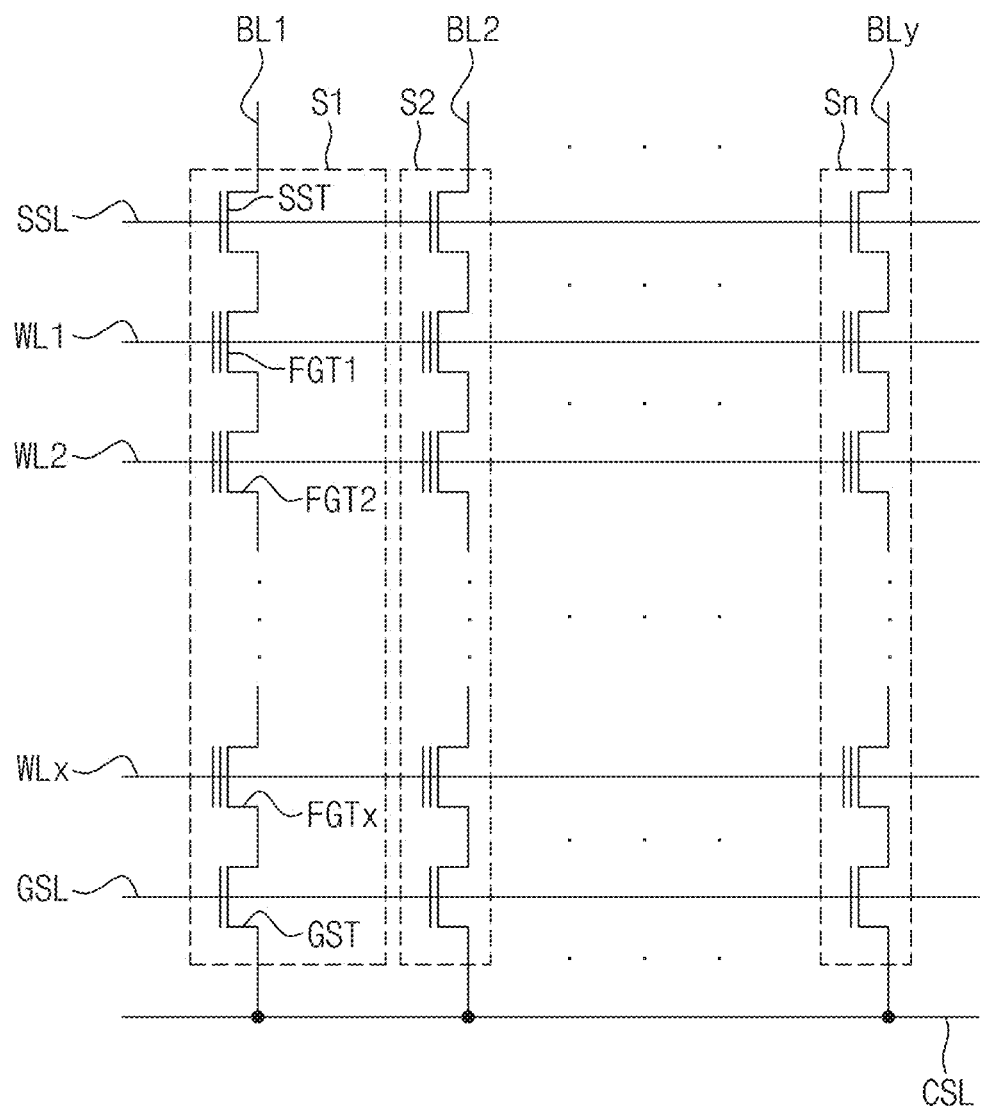
FIG. 3 is a circuit diagram of an example configuration of each of blocks BLK1 to BLKn according to some example embodiments of some inventive concepts.

FIG. 3 is a circuit diagram of an example configuration of each of n blocks BLK1 to BLKn according to some example embodiments of some inventive concepts. Each of the n blocks BLK1 to BLKn may include m strings S1 to Sm, which are connected in parallel between each of y bit lines BL1 to BLy and a common source line CSL. Each of the m strings S1 to Sm may include a string selection transistor SST, x floating gate transistors FGT1 to FGTx, and a ground selection transistor GST, which are connected in series. Gates of m string selection transistors SST of the m strings S1 to Sm may be connected in common to the string selection line SSL, and gates of m corresponding floating gate transistors FGT1, FGT2, . . . , or FGTx of the m strings S1 to Sm may be connected to a corresponding word line WL1, WL2, . . . , or WLx. Gates of m ground selection transistors GST may be connected in common to a ground selection line GSL.

The blocks BLK1 to BLKn shown in FIG. 3 may be a configuration of blocks of a memory cell array of a NAND flash memory.

The flash memory shown in FIGS. 1 to 3 may perform a program operation, a read operation, or an erase operation based on operations of a known NAND flash memory.

FIG. 4 is a diagram showing an example arrangement of a first semiconductor layer 12 according to some example embodiments of some inventive concepts. The first semiconductor layer 12 may include four peripheral circuit regions PERIA, PERIB, PERIC, and PERID and a global peripheral circuit region PERIE. The global peripheral circuit region PERIE may be under and adjacent to the four peripheral circuit regions PERIA, PERIB, PERIC, and PERID.

The arrangement of the first semiconductor layer 12 will be described as follows with reference to FIG. 4.

An external power supply voltage pad EVCCP, an external ground voltage pad EVSSP, a global reference voltage generator GVREFG, and a ground voltage noise detector GNDND may be in the center of the global peripheral circuit region PERIE. The external power supply voltage pad EVCCP may be adjacent to an external power supply voltage terminal (e.g., a pad or a ball), and the external ground voltage pad EVSSP may be adjacent to an external ground voltage terminal.

First and second row decoder regions RD1 and RD2 in which a row decoder is may be in an upper portion of and a lower portion of each of the four peripheral circuit regions PERIA, PERIB, PERIC, and PERID. A region PBD of a page buffer decoder, a region PB of a page buffer, a region CONG of a controller, and a region CAG of a command and address generator may be between the first row decoder region RD1 and the second row decoder region RD2. The region PBD of the page buffer decoder may be on a left side, the region PB of the page buffer may be in the center, and the region CONG of the controller and the region CAG of the command and address generator may be on a right side vertically. A corresponding local reference voltage generator LVREFGA, LVREFGB, LVREFGC, or LVREFGD may be in the second row decoder region RD2 of a second row decoder (or, unlike that which is shown, a region adjacent to the second row decoder region RD2 of the second row decoder) under the region PBD of the page buffer decoder. That is, a corresponding local reference voltage generator of each of the planes may be in a region of the row decoder and/or a region adjacent to the region of the row decoder, where the region of the local reference voltage generator (e.g., a region of the row decoder and/or the region adjacent to the region of the row decoder) may be adjacent to a region of the page buffer decoder. A plurality of corresponding local internal power supply voltage drivers LIVCD may be in a row in the region PBD of the page buffer decoder. An internal ground voltage node IVSSN may be at a specific position of the region PB of the page buffer. The internal ground voltage node IVSSN may be at a distance (e.g., beyond a threshold distance) from the external ground voltage terminal EVSSP or in at least one position in which a large amount of current is consumed (for example, during an operation).

Although not shown, circuits configured to generate various voltages required for operations of a flash memory may be further in peripheral circuit regions.

Functions of each block shown in FIG. 4 will be described as follows.

The global reference voltage generator GVREFG may convert a level of the external power supply voltage EVCC and generate a global reference voltage GVREF. For example, the global reference voltage generator GVREFG may lower the external power supply voltage EVCC (e.g., 2.7 V to 3.5 V) and generate the global reference voltage GVREF (e.g., 2 V).

The ground voltage noise detector GNDND may detect voltage differences between an external ground voltage EVSS and internal ground voltages IVSSA, IVSSB, IVSSC, and IVSSD of internal ground voltage nodes IVSSN of the four peripheral circuit regions PERIA, PERIB, PERIC, and PERID and generate ground voltage noise reference voltages VNREFA, VNREFB, VNREFC, and VNREFD. That is, the ground voltage noise detector GNDND may detect ground voltage noise of a corresponding plane 10-2, 10-4, 10-6, or 10-8 for the corresponding peripheral circuit regions PERIA, PERIB, PERIC, and PERID, which may occur during a program operation, a read operation, or an erase operation of the corresponding plane 10-2, 10-4, 10-6, or 10-8, and generate the ground voltage noise reference voltages VNREFA, VNREFB, VNREFC, and VNREFD. Although the internal ground voltages IVSSA, IVSSB, IVSSC, and IVSSD are illustrated as being combined at a common node in FIG. 4, the internal ground voltages IVSSA, IVSSB, IVSSC, and IVSSD may be separately applied to the ground voltage noise detector GNDND. In some example embodiments, unlike that which is shown in FIG. 4, the internal ground voltages IVSSA, IVSSB, IVSSC, and IVSSD may be combined at the common node and/or generated as one internal ground voltage, and/or a ground voltage noise detector 12-4 may detect a voltage difference between the external ground voltage EVSS and the one internal ground voltage and generate one ground voltage noise reference voltage.

The corresponding local reference voltage generator LVREFGA, LVREFGB, LVREFGC, or LVREFGD of the peripheral circuit region PERIA, PERIB, PERIC, or PERID may generate a corresponding local reference voltage LVREFA, LVREFB, LVREFC, or LVREFD based on the global reference voltage GVREF and the corresponding ground voltage noise reference voltage VNREFA, VNREFB, VNREFC, or VNREFD. However, unlike that which is shown, the local reference voltage generators LVREFGA, LVREFGB, LVREFGC, and LVREFGD of the peripheral circuit regions PERIA, PERIB, PERIC, and PERID may generate a local reference voltage LVREF based on the global reference voltage GVREF and the same or similar ground voltage noise reference voltage.

The plurality of corresponding internal power supply voltage drivers LIVCD of the peripheral circuit region PERIA, PERIB, PERIC, or PERID may generate corresponding internal power supply voltages IVCA, IVCB, IVCC, or IVCD based on the corresponding local reference voltage LVREFA, LVREFB, LVREFC, or LVREFD. However, unlike that which is shown, the internal power supply voltage drivers LIVCD of the peripheral circuit regions PERIA, PERIB, PERIC, and PERID may generate the same or similar internal reference voltage based on the same or similar local reference voltage. It is to be appreciated that the number of internal power supply voltage drivers LIVCD may vary among some example embodiments.

First and second row decoders (not shown) in the first and second row decoder regions RD1 and RD2 of the peripheral circuit region PERIA, PERIB, PERIC, or PERID may decode a row address (not shown), select one block out of n blocks BLK1 to BLKn and select one word line out of x word lines WL1 to WLx included in the selected block. That is, the first and second row decoders may select one page.

A page buffer decoder (not shown) in the region PBD of the peripheral circuit region PERIA, PERIB, PERIC, or PERID may decode a column address (not shown) and select one bit line out of y bit lines BL1 to B1y.

A page buffer (not shown) in the region PB of the peripheral circuit region PERIA, PERIB, PERIC, or PERID may buffer data to be stored in selected memory cells of a memory cell array of a corresponding memory cell array region MCAA, MCAB, MCAC, or MCAD and/or data output from the selected memory cells.

A command and address generator (not shown) in the region CAG of a corresponding command and address generator of the peripheral circuit region PERIA, PERIB, PERIC, or PERID is may receive a command and an address from the outside and generate a command signal (not shown), a row address (not shown), and a column address (not shown). Command and address generators (not shown) in the regions CAG of command and address generators of the peripheral circuit regions PERIA, PERIB, PERIC, and PERID may receive the same command and the same address or different commands and different addresses which may be independently applied from the outside.

In some example embodiments, a controller (not shown) in the region CONG of a corresponding controller of the peripheral circuit region PERIA, PERIB, PERIC, or PERID may be configured to generate control signals indicating a corresponding command based on (e.g., in response to) a command signal (not shown). Regions CONG of the controllers of the peripheral circuit regions PERIA, PERIB, PERIC, and PERID are may be configured to generate the same or similar control signal or different control signals based on the same command signal (not shown) or different command signals (not shown).

Although not shown, in some example embodiments, the external ground voltage EVSS may be applied from the external ground voltage terminal EVSSP to the local reference voltage generators LVREFGA, LVREFGB, LVREFGC and LVREFGD and the internal power supply voltage drivers LIVCD. For example, the external ground voltage EVSS may be applied to the local reference voltage generators LVREFGA, LVREFGB, LVREFGC, and LVREFGD and the internal power supply voltage drivers LIVCD through metal lines connected to the external ground voltage terminal EVSSP. The metal lines may be in a mesh form between first semiconductor layers 12 shown in FIG. 1, between second semiconductor layers 14, between the first semiconductor layer 12 and the second semiconductor layer 14, under the first semiconductor layer 12, or on the second semiconductor layer 14.

In some example embodiments, including the flash memory shown in FIGS. 1 to 4, the planes 10-2, 10-4, 10-6, and 10-8 may independently perform the same operation and/or different operations. Thus, different ground voltage noises may occur with respect to the planes 10-2, 10-4, 10-6, and 10-8. In this case, the ground voltage noise detector GNDND shown in FIG. 4 and the corresponding local reference voltage generators LVREFGA, LVREFGA, LVREFGC, or LVREFGD may detect the corresponding ground voltage noise occurring with respect to each of the planes 10-2, 10-4, 10-6, and 10-8, compensate for the corresponding local reference voltage LVREFA, LVREFB, LVREFC, or LVREFD based on the corresponding ground voltage noise, and generate the corresponding local internal power supply voltages IVCA, IVCB, IVCC, or IVCD. It is to be appreciated that the number of planes may vary among some example embodiments; for example, the number of planes may be selected and/or predetermined as being two, four, six, or a different number.

FIG. 5 is a diagram for explaining variations in local reference voltages LVREFA, LVREFB, LVREFC, and LVREFD according to variations in internal ground voltages IVSSA, IVSSB, IVSSC, and IVSSD in planes 10-2, 10-4, 10-6, and 10-8 according to some example embodiments of some inventive concepts. FIG. 5 is a diagram showing example variations in local reference voltages LVREFA, LVREFB, LVREFC, and LVREFD according to the variations in internal ground voltages IVSSA, IVSSB, IVSSC, and IVSSD, which are generated at internal ground voltage nodes IVSSN of the planes 10-2, 10-4, 10-6, and 10-8, when a read operation is performed based on a read command in the plane 10-2, when a program operation is performed based on a program command in the plane 10-4, when an erase operation is performed based on an erase command in the plane 10-6, and when a read operation is performed based on a read command in the plane 10-8.

Referring to FIG. 5, different internal ground voltages IVSSA, IVSSB, IVSSC, and IVSSD may be generated at the internal ground voltage nodes IVSSN of each of the planes 10-2, 10-4, 10-6, and 10-8. That is, although an internal ground voltage IVSS that is equal to an external ground voltage EVSS may be generated at the internal ground voltage nodes IVSSN, the different internal ground voltages IVSSA, IVSSB, IVSSC, and IVSSD may be substantially generated. A global reference voltage generator GVREFG may generate a constant global reference voltage GVREF. Internal power supply voltage margins of the planes 10-2, 10-4, 10-6, and 10-8 may be reduced to $\Delta$IVCA', $\Delta$IVCB', $\Delta$IVCC', and $\Delta$IVCD', respectively. In this case, the ground voltage noise detector GNDND shown in FIG. 4 may detect ground voltage noises generated in the planes 10-2, 10-4, 10-6, and 10-8 and generate ground voltage noise reference voltages VNREFA, VNREFB, VNREFC, and VNREFD. Further, a corresponding local reference voltage generator LVREFGA, LVREFGB, LVREFGC, and LVREFGD of the corresponding plane 10-2, 10-4, 10-6, or 10-8 shown in FIG. 4 may add a corresponding ground voltage noise reference voltage VNREFA, VNREFB, VNREFC, or VNREFD to the global reference voltage GVREF and generate a corresponding local reference voltage LVREFA, LVREFB, LVREFC, or LVREFD. Thus, the internal power supply voltage margins of the planes 10-2, 10-4, 10-6, and 10-8 may be compensated for to be ΔIVCA, ΔIVCB, ΔIVCC, and ΔIVCD. That is, the internal power supply voltage margins of the planes 10-2, 10-4, 10-6, and 10-8 may be the same or similar target internal power supply voltage margin.

Figure 6:
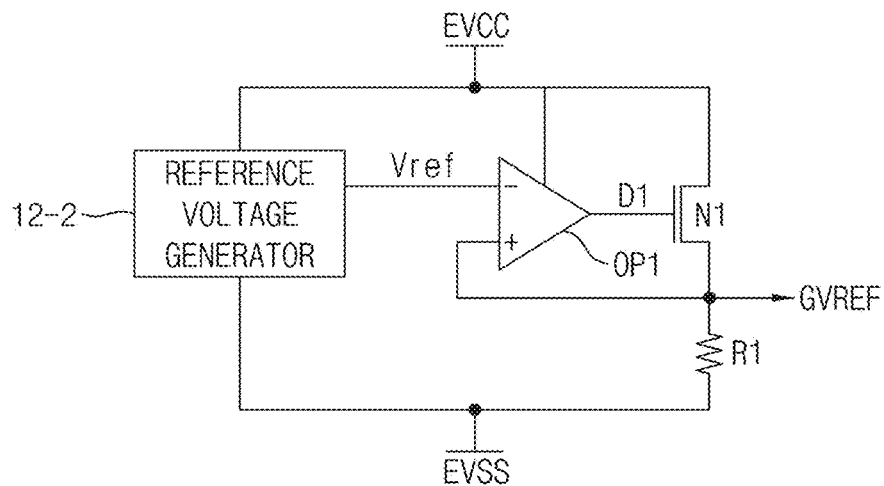
FIG. 6 is a circuit diagram showing an example configuration of a global reference voltage generator according to some example embodiments of some inventive concepts.

FIG. 6 is a circuit diagram showing an example configuration of a global reference voltage generator GVREFG according to some example embodiments of some inventive concepts. The global reference voltage generator GVREFG may include a reference voltage generator 12-2, a first differential amplifier OP1, a first N-type metal-oxide-semiconductor (NMOS) transistor N1, and a first resistor R1.

Referring to FIG. 6, the reference voltage generator 12-2 may be connected between an external power supply voltage EVCC and an external ground voltage EVSS and generate a reference voltage Vref between the external power supply voltage EVCC and the external ground voltage EVSS. The reference voltage generator 12-22 may be a band gap reference circuit.

The first differential amplifier OP1 may generate a first driving voltage D1 based on a difference between the reference voltage Vref and a global reference voltage GVREF. For instance, the first differential amplifier OP1 may increase the first driving voltage D1 in proportion to the difference between the global reference voltage GVREF and the reference voltage Vref when the global reference voltage GVREF is lower than the reference voltage Vref. The first differential amplifier OP1 may lower the first driving voltage D1 in proportion to the difference between the global reference voltage GVREF and the reference voltage Vref when the global reference voltage GVREF is higher than the reference voltage Vref.

The first NMOS transistor N1 may drive the external power supply voltage EVCC based on the first driving voltage D1 and generate the global reference voltage GVREF. The first NMOS transistor N1 may increase the global reference voltage GVREF when the first driving voltage D1 is increased and lower the global reference voltage GVREF when the first driving voltage D1 drops.

The global reference voltage generator GVREFG shown in FIG. 6 may operate such that the global reference voltage GVREF is equalized to the reference voltage Vref.

Figure 7:
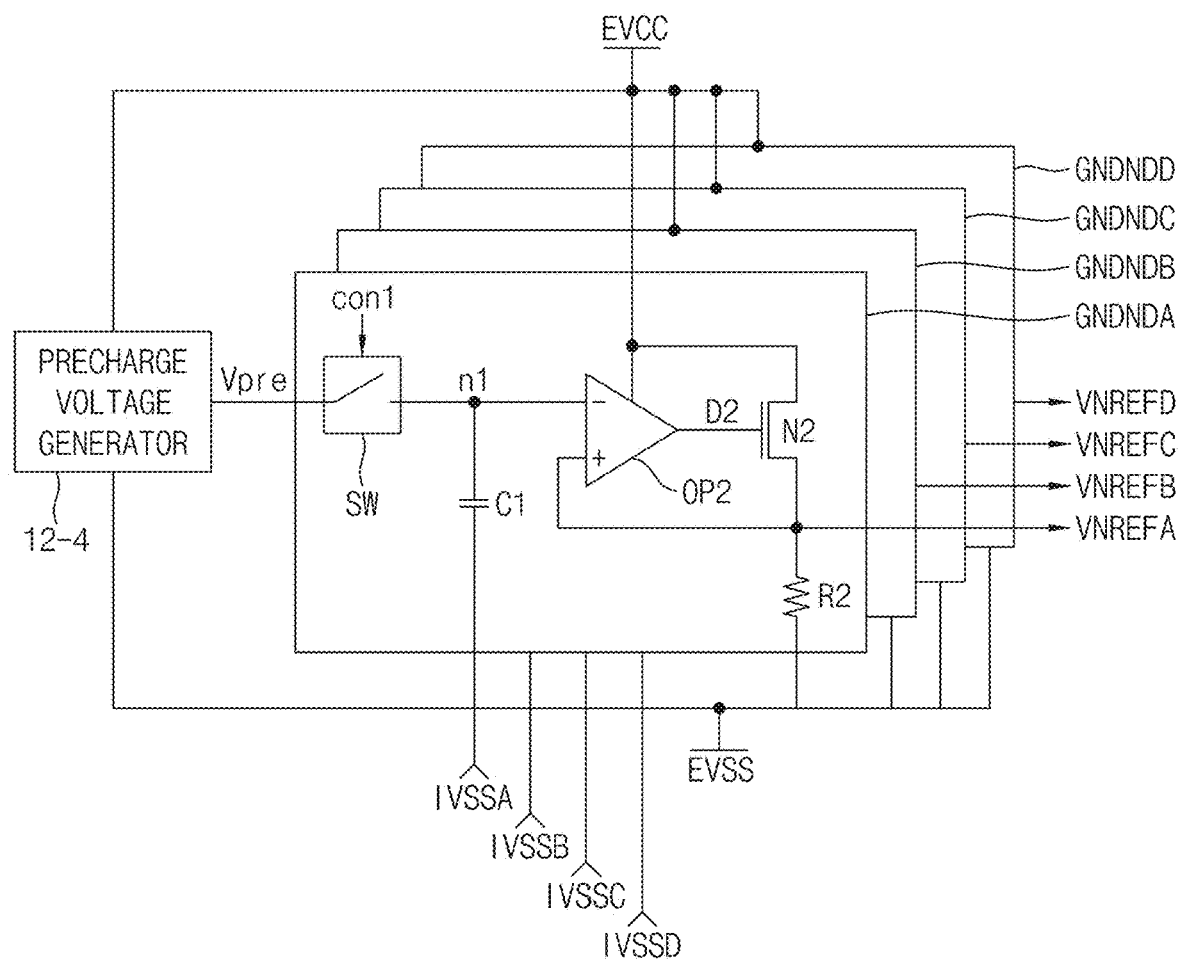
FIG. 7 is a diagram showing an example configuration of a ground voltage noise detector according to some example embodiments of some inventive concepts.

FIG. 7 is a diagram showing an example configuration of a ground voltage noise detector GNDND according to some example embodiments of some inventive concepts. The ground voltage noise detector GNDND may include a precharge voltage generator 12-4 and four sub-ground voltage noise detectors GNDNDA, GNDNDB, GNDNDC, and GNDNDD. Each of the four sub-ground voltage noise detectors GNDNDA, GNDNDB, GNDNDC, and GNDNDD may include a switch SW, a first capacitor C1, a second differential amplifier OP2, a second NMOS transistor N2, and a second resistor R2.

Referring to FIG. 7, the precharge voltage generator 12-4 may be connected between an external power supply voltage EVCC and an external ground voltage EVSS and generate a precharge voltage Vpre between the external power supply voltage EVCC and the external ground voltage EVSS. The precharge voltage Vpre may have a lower level than a reference voltage Vref. For example, when the external power supply voltage EVCC is 2.7 V to 3.5 V, the reference voltage Vref may be 2.0 V, and the precharge voltage Vpre may be 1.2 V.

The switch SW of each of the four sub-ground voltage noise detectors GNDNDA, GNDNDB, GNDNDC, and GNDNDD may be turned on based on a first control signal con1 and transmit the precharge voltage Vpre to a first node n1. The first control signal con1 may be generated by a controller (not shown) in the region CONG of each of the planes 10-2, 10-4, 10-6, and 10-8 shown in FIG. 4. That is, the controller (not shown) may be configured to generate the first control signal con1 based on a command signal.

The first capacitor C1 of each of the four sub-ground voltage noise detectors GNDNDA, GNDNDB, GNDNDC, and GNDNDD may be charged with the pre-charge voltage Vpre and vary a voltage level of the first node n1 according to a variation in level of the corresponding internal ground voltage IVSSA, IVSSB, IVSSC, or IVSSD. That is, when the level of the corresponding internal ground voltage IVSSA, IVSSB, IVSSC, or IVSSD is increased, the voltage level of the first node n1 may be increased from a level of the precharge voltage Vpre, whereas when the level of the corresponding internal ground voltage IVSSA, IVSSB, IVSSC, or IVSSD is reduced, the voltage level of the first node n1 may be decreased from the level of the precharge voltage Vpre.

The second differential amplifier OP2 of each of the four sub-ground voltage noise detectors GNDNDA, GNDNDB, GNDNDC, and GNDNDD may generate a corresponding second driving voltage D2 based on a difference between a voltage of the first node n1 and a corresponding ground voltage noise reference voltage VNREFA, VNREFB, VNREFC, or VNREFD. For example, the second differential amplifier OP2 may increase the second driving voltage D2 in proportion to the difference between the corresponding ground voltage noise reference voltage VNREFA, VNREFB, VNREFC, or VNREFD and the voltage of the first node n1 when the corresponding ground voltage noise reference voltage VNREFA, VNREFB, VNREFC, or VNREFD is lower than the voltage of the first node n1. The second differential amplifier OP2 may lower the second driving voltage D2 in proportion to the difference between the corresponding ground voltage noise reference voltage VNREFA, VNREFB, VNREFC, or VNREFD and the voltage of the first node n1 when the corresponding ground voltage noise reference voltage VNREFA, VNREFB, VNREFC, or VNREFD is higher than the voltage of the first node n1.

The second NMOS transistor N2 of each of the four sub-ground voltage noise detectors GNDNDA, GNDNDB, GNDNDC, and GNDNDD may drive the external power supply voltage EVCC based on the corresponding second driving voltage D2 and generate the corresponding ground voltage noise reference voltage VNREFA, VNREFB, VNREFC, or VNREFD. The second NMOS transistor N2 may increase the corresponding ground voltage noise reference voltage VNREFA, VNREFB, VNREFC, or VNREFD when the corresponding second driving voltage D2 is increased and lower the corresponding ground voltage noise reference voltage VNREFA, VNREFB, VNREFC, or VNREFD when the corresponding second driving voltage D2 drops.

When a level of the corresponding internal ground voltage IVSSA, IVSSB, IVSSC, or IVSSD is increased, the ground voltage noise detector GNDND shown in FIG. 7 may add the increased level of the corresponding internal ground voltage IVSSA, IVSSB, IVSSC, or IVSSD to the precharge voltage Vpre and generate the corresponding ground voltage noise reference voltage VNREFA, VNREFB, VNREFC, or VNREFD.

Figure 8:
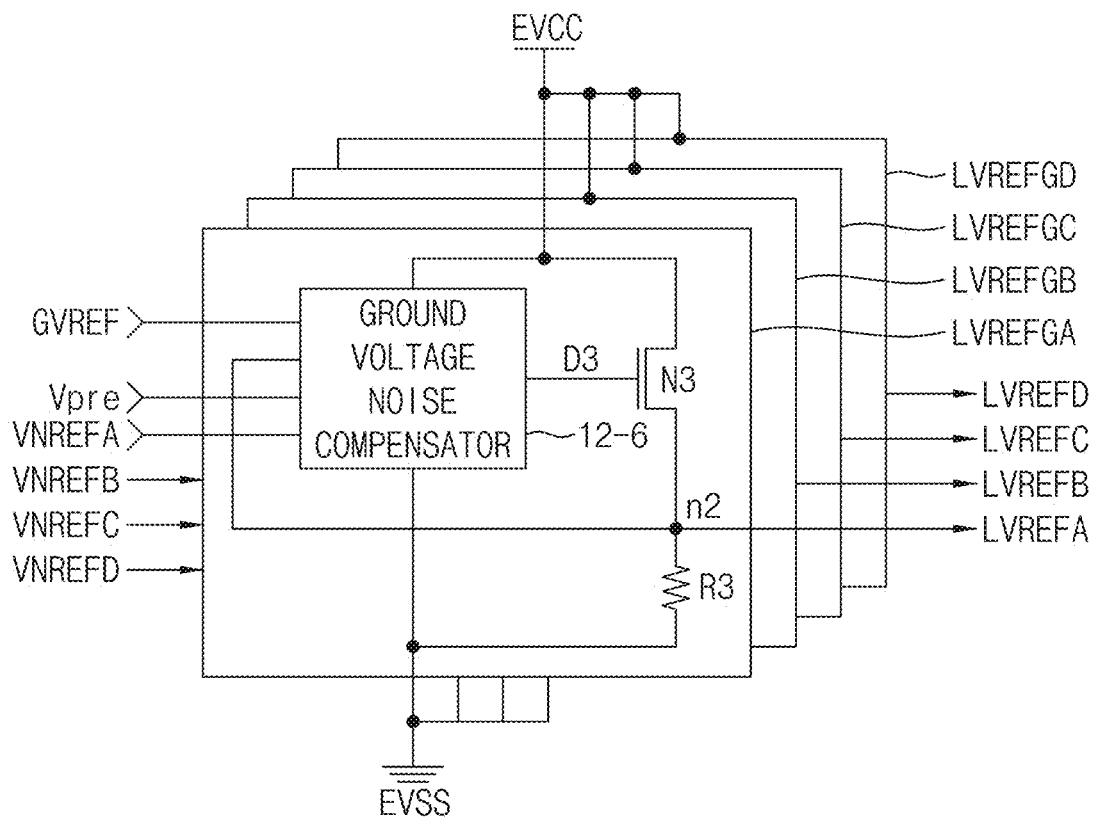
FIG. 8 is a diagram showing an example configuration of local reference voltage generators according to some example embodiments of some inventive concepts.

FIG. 8 is a diagram showing an example configuration of local reference voltage generators LVREFGA, LVREFGB, LVREFGC, and LVREFGD according to some example embodiments of some inventive concepts. Each of the local reference voltage generators LVREFGA, LVREFGB, LVREFGC, and LVREFGD may include a ground voltage noise compensator 12-6, a third NMOS transistor N3, and a third resistor R3.

Referring to FIG. 8, the ground voltage noise compensator 12-6 of each of the local reference voltage generators LVREFGA, LVREFGB, LVREFGC, and LVREFGD may generate a third driving voltage D3 based on a global reference voltage GVREF, a corresponding local reference voltage LVREFA, LVREFB, LVREFC, or LVREFD, a precharge voltage Vpre, and a corresponding ground voltage noise reference voltage VNREFA, VNREFB, VNREFC, or VNREFD. That is, the ground voltage noise compensator 12-6 may generate the third driving voltage D3 based on a difference between the global reference voltage GVREF and the corresponding local reference voltage LVREFA, LVREFB, LVREFC, or LVREFD and a difference between the precharge voltage Vpre and the corresponding ground voltage noise reference voltage VNREFA, VNREFB, VNREFC, or VNREFD.

The third NMOS transistor N3 of each of the local reference voltage generators LVREFGA, LVREFGB, LVREFGC, and LVREFGD may drive an external power supply voltage EVCC based on the corresponding third driving voltage D3 and generate the corresponding local reference voltage LVREFA, LVREFB, LVREFC, or LVREFD. The third NMOS transistor N3 may increase the corresponding local reference voltage LVREFA, LVREFB, LVREFC, or LVREFD when the corresponding third driving voltage D3 is increased and lower the corresponding local reference voltage LVREFA, LVREFB, LVREFC, or LVREFD when the corresponding third driving voltage D3 drops.

Each of the local reference voltage generators LVREFGA, LVREFGB, LVREFGC, and LVREFGD shown in FIG. 8 may generate the third driving voltage D3 based on the difference between the global reference voltage GVREF and the corresponding local reference voltage LVREFA, LVREFB, LVREFC, or LVREFD and the difference between the precharge voltage Vpre and the corresponding ground voltage noise reference voltage VNREFA, VNREFB, VNREFC, or VNREFD, compensate for the corresponding ground voltage noise reference voltage VNREFA, VNREFB, VNREFC, or VNREFD based on the third driving voltage D3, and generate the corresponding local reference voltage LVREFA, LVREFB, LVREFC, or LVREFD.

Figure 9:
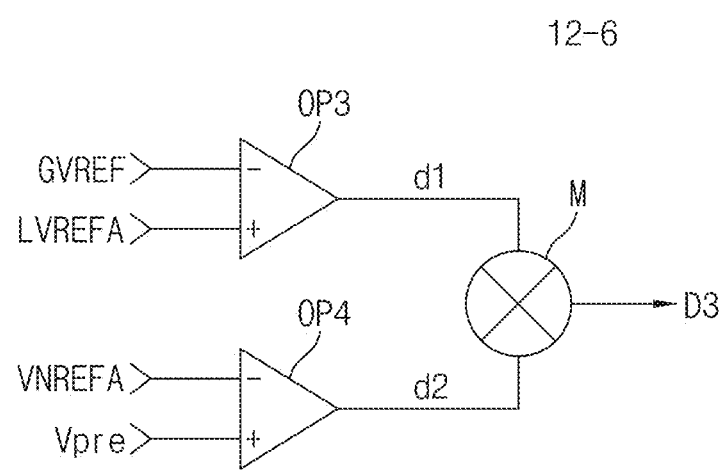
FIG. 9 is a diagram showing an example configuration of a ground voltage noise compensator according to some example embodiments of some inventive concepts.

FIG. 9 is a diagram showing an example configuration of a ground voltage noise compensator 12-6 according to some example embodiments of some inventive concepts. The ground voltage noise compensator 12-6 may include third and fourth differential amplifiers OP3 and OP4 and a mixer M.

Referring to FIG. 9, the third differential amplifier OP3 may generate a first sub-driving voltage d1 based on a difference between a global reference voltage GVREF and a local reference voltage LVREFA of a second node n2. The third differential amplifier OP3 may increase the first sub-driving voltage d1 in proportion to the difference between the global reference voltage GVREF and the local reference voltage LVREFA when the local reference voltage LVREFA is lower than the global reference voltage GVREF. The third differential amplifier OP3 may lower the first sub-driving voltage d1 in proportion to the difference between the global reference voltage GVREF and the local reference voltage LVREFA when the local reference voltage LVREFA is higher than the global reference voltage GVREF.

The fourth differential amplifier OP4 may generate a second sub-driving voltage d2 based on a difference between a ground voltage noise reference voltage VNREFA and a precharge voltage Vpre. The fourth differential amplifier OP4 may lower the second sub-driving voltage d2 in proportion to the difference between the ground voltage noise reference voltage VNREFA and the precharge voltage Vpre when the ground voltage noise reference voltage VNREFA is lower than the pre-charge voltage Vpre. The fourth differential amplifier OP4 may increase the second sub-driving voltage d2 in proportion to the difference between the ground voltage noise reference voltage VNREFA and the precharge voltage Vpre when the ground voltage noise reference voltage VNREFA is higher than the pre-charge voltage Vpre.

The mixer M may mix (e.g., add) the first sub-driving voltage d1 and the second sub-driving voltage d2 and generate a third driving voltage D3.

FIG. 9 shows an example in which the ground voltage noise compensator 12-6 of the local reference voltage generator LVREFGA and a ground voltage noise compensator 12-6 of each of local reference voltage generators LVREFGB, LVREFGC, and LVREFGD, which are not shown, may have the same or similar configuration as in FIG. 9.

Figure 10:
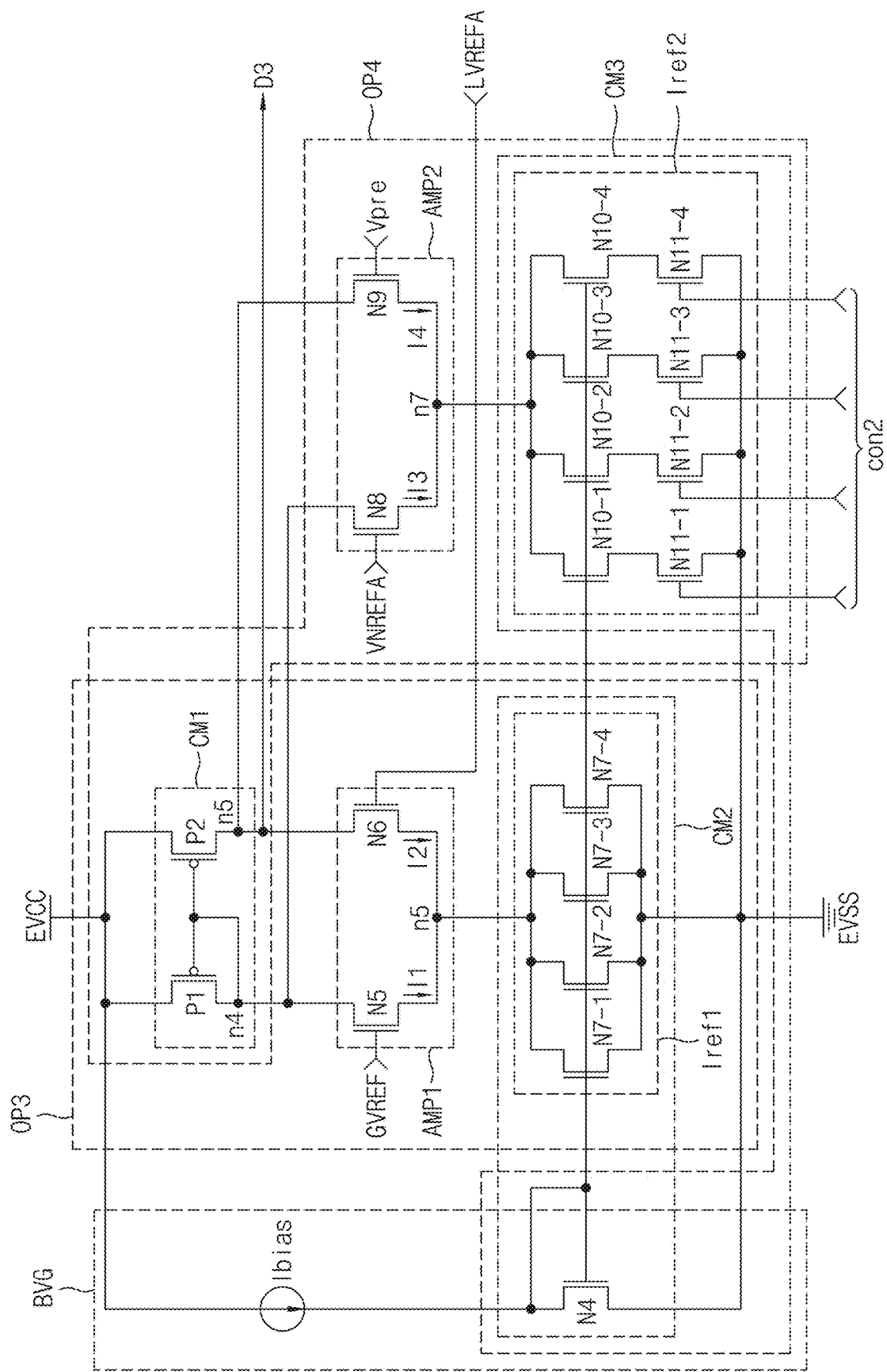
FIG. 10 is a detailed circuit diagram showing an example ground voltage noise compensator according to some example embodiments of some inventive concepts.

FIG. 10 is a detailed circuit diagram showing an example ground voltage noise compensator 12-6 according to some example embodiments of some inventive concepts. The ground voltage noise compensator 12-6 may include a bias voltage generator BVG and third and fourth differential amplifiers OP3 and OP4.

A configuration of a circuit shown in FIG. 10 will be described as follows.

The bias voltage generator BVG may include a bias current source Ibias and a fourth NMOS transistor N4, which are connected between an external power supply voltage EVCC and an external ground voltage EVSS. The bias voltage generator BVG may generate a bias voltage Vbias based on a bias current of the bias current source Ibias.

The third differential amplifier OP3 may include a first current mirror CM1, a first differential sensor AMP1, and a first constant current source Iref1, which are connected in series between the external power supply voltage EVCC and the external ground voltage EVSS. The first current mirror CM1 may include first and second PMOS transistors P1 and P2, which are connected in parallel between the external power supply voltage EVCC and fourth and fifth nodes n4 and n5. The first differential sensor AMP1 may include fifth and sixth NMOS transistors N5 and N6, which are connected in parallel between the fourth and fifth nodes n4 and n5 and a sixth node n6. A global reference voltage GVREF and a local reference voltage LVREFA may be respectively applied to gates of fifth and sixth NMOS transistors N5 and N6. The first constant current source Iref1 may include seventh NMOS transistors N7-1 to N7-4, which are connected in parallel between the sixth node n6 and the external ground voltage EVSS. The fourth NMOS transistor N4 and the seventh NMOS transistors N7-1 to N7-4 may constitute a second current mirror CM2.

The fourth differential amplifier OP4 may include the first current mirror CM1, a second differential sensor AMP2, and a second constant current source Iref2, which are connected in series between the external power supply voltage EVCC and the external ground voltage EVSS. The second differential sensor AMP2 may include eighth and ninth NMOS transistors N8 and N9, which are connected in parallel between the fourth and fifth nodes n4 and n5 and a seventh node n7. A ground voltage noise reference voltage VNREFA and a precharge voltage Vpre may be respectively applied to gates of the eighth and ninth NMOS transistors N8 and N9. The second constant current source Iref2 may include tenth NMOS transistors N10-1 to N10-4 and eleventh NMOS transistors N11-1 to N11-4, which are connected in parallel between the seventh node n7 and the external ground voltage EVSS. Here, each of the tenth NMOS transistors N10-1 to N10-4 may be connected in series to a corresponding one of the eleventh NMOS transistors N11-1 to N11-4. The fourth NMOS transistor N4, the tenth NMOS transistors N10-1 to N10-4, and the eleventh NMOS transistors N11-1 to N11-4 may constitute a third current mirror CM3.

A circuit shown in FIG. 10 may have a configuration of a Gilbert cell mixer.

Operations of components shown in FIG. 10 will be described as follows.

The first current mirror CM1 may mirror a first current I1 and generate a second current I2.

The second current mirror CM2 may mirror the bias current Ibias and generate a first constant current of the first constant current source Iref1.

The first differential sensor AMP1 may sense a difference between the global reference voltage GVREF and the local reference voltage LVREFA and generate the first current I1 and the second current I2. When the difference between the global reference voltage GVREF and the local reference voltage LVREFA is large, that is, when the local reference voltage LVREFA is much lower than the global reference voltage GVREF, the first current I1 may become much larger than the second current I2. That is, a level of a first sub-driving voltage d1 may be greatly elevated. In contrast, when the difference between the global reference voltage GVREF and the local reference voltage LVREFA is small, that is, when the local reference voltage LVREFA is slightly lower than the global reference voltage GVREF, the first current I1 may become slightly larger than the second current I2. That is, the level of the first sub-driving voltage d1 may be slightly elevated. The third current mirror CM3 may mirror the bias current Ibias and generate a second constant current of the second constant current source Iref2. The third current mirror CM3 may adjust the number of the eleventh NMOS transistors N11-1 to N11-4, which are turned on based on a second control signal con2, and adjust a compensated amount of ground voltage noise. For example, as the number of the tenth NMOS transistors N10-1 to N10-4 and the number of the eleventh NMOS transistors N11-1 to N11-4, which generate the second constant current of the second constant current source Iref2, become smaller as compared with the number of the seventh NMOS transistors N7-1 to N7-4, which generate the first constant current of the first constant current source Iref1, the compensated amount of the ground voltage noise may be reduced. As the number of the tenth NMOS transistors N10-1 to N10-4 and the number of the eleventh NMOS transistors N11-1 to N11-4 become larger, the compensated amount of the ground voltage noise may increase. The second control signal con2 may be generated by a controller (not shown) in the region CONG of each of the planes 10-2, 10-4, 10-6, and 10-8 shown in FIG. 4. That is, the controller (not shown) may generate a second control signal con2 including 4-bit digital data based on a command signal.

The second differential sensor AMP2 may sense a difference between the ground voltage noise reference voltage VNREFA and the precharge voltage Vpre and generate a third current I3 and a fourth current I4. When the difference between the ground voltage noise reference voltage VNREFA and the precharge voltage Vpre is large, that is, when the ground voltage noise reference voltage VNREFA is much higher than the precharge voltage Vpre, the third current I3 may be much larger than the fourth current I4. That is, a level of a second sub-driving voltage d2 may be elevated to a large extent. In contrast, when the ground voltage noise reference voltage VNREFA is slightly higher than the precharge voltage Vpre, the third current I3 may be slightly larger than the fourth current I4. That is, the level of the second sub-driving voltage d2 may be slightly elevated.

When the first sub-driving voltage D1 is generated at the fourth node n4 by the third differential amplifier OP3 and the second sub-driving voltage d2 is generated at the fourth node n4 by the fourth differential amplifier OP4, the first sub-driving voltage d1 may be added to the second sub-driving voltage d2 at the fourth node n4 to generate a driving voltage D3.

Operations of the ground voltage noise compensator 12-6 shown in FIG. 10 may be described using equations as follows.

$$I2=I1+\Delta I3$$

$$I1=gm1 \times Vgs1$$

$$I2=gm2 \times Vgs2$$

$$\Delta I3=gm3 \times \Delta Vgs3,$$

wherein gm1, gm2, and gm3 denote mutual conductances of the fifth NMOS transistor N5, the sixth NMOS transistor N6, and the eighth NMOS transistor N8, respectively, Vgs1 and Vgs2 denote gate-source voltages of the fifth NMOS transistor N5 and the sixth NMOS transistor N6, respectively, I1 and I2 denote currents flowing through the fifth NMOS transistor N5 and the sixth NMOS transistor N6, respectively, ΔVgs3 denotes a variation of a gate-source voltage of the eighth NMOS transistor N8 (i.e., Vgs3-Vgs4, where Vgs4 denotes a gate-source voltage of the ninth NMOS transistor N9), and ΔI3 denotes a variation of current flowing through the eighth NMOS transistor N8 (i.e., I3-I4, where I4 denotes a current flowing through the ninth NMOS transistor N9).

$$gm2 \times Vgs2=(gm1 \times Vgs1)+(gm3 \times \Delta Vgs3)$$

Assuming that gm1 is equal to gm2, the above equation may be expressed as follows.

$$Vgs2=Vgs+gm3/gm2 \times \Delta Vgs3$$

$$Vgs1=Vref, Vgs2=LIVC\_Vref, \Delta Vgs3=\Delta Vnoise$$

$$gm1 = \sqrt{2\mu C\left(\frac{W1}{L1}\right)I1}, gm2 = \sqrt{2\mu C\left(\frac{W2}{L2}\right)I2},$$

$$gm3 = \sqrt{2\mu C\left(\frac{W3}{L3}\right)I3},$$

wherein W1, W2, and W3 denote channel widths of the fifth, sixth, and eighth NMOS transistors N5, N6, and N8, respectively, and L1, L2, and L3 denote channel lengths of the fifth, sixth, and eighth NMOS transistors N5, N6, and N8, respectively. μC denotes a transconductance parameter of the fifth, sixth, and eighth NMOS transistors N5, N6, and N8. μ denotes electron mobility, and C denotes a gate oxide capacitance.

$$LIVC\_Vref = Vref + \sqrt{\frac{W3I2}{W2I2}} \times \Delta Vnoise$$

$$LIVC\_Vref - Vref = \Delta LIVC\_Vref = \sqrt{\frac{W3I2}{W2I2}} \times \Delta Vnoise$$

As can be seen from the above equation, assuming that W2I2 is equal to W3I3, ΔLIVC_Vref may be equal to ΔVnoise. This indicates that a variation of the ground voltage noise reference voltage VNREFA is directly reflected in a variation of the local reference voltage LVREFA. By making the channel width of the sixth NMOS transistor N6 to the channel width of the eighth NMOS transistor N7 be the same or similar, and by differently adjusting constant current amounts of the first constant current source Iref1 and the second constant current source Iref2 related to the second current I2 and the third current I3, a compensated amount by which the variation of the ground voltage noise reference voltage VNREFA is reflected in the variation of the local reference voltage LVREFA may be adjusted. To adjust the compensated amount, the number of the eleventh NMOS transistors N11-1 to N11-4 may be adjusted by varying a code value of the second control signal con2.

For example, operation periods in which the compensated amount of the ground voltage noise is to be increased may include an operation period (e.g., a bit line setup period, a bit line precharge operation period, and the like, in a read operation) in which a large amount of current is consumed in memory cell array regions MCAA, MCAB, MCAC, and MCAD and an operation period (e.g., an operation period (e.g., an operation section for initializing latches (not shown) of a page buffer (not shown), an operation period of verifying data programmed to memory cells at specific nodes (not shown) of the page buffer (not shown), and the like) in which a large amount of current is consumed in page buffer regions PB. The ground voltage noise compensator 12-6 shown in FIG. 10 may increase the compensated amount of the ground voltage noise in the operation periods. Further, since consumed currents may vary according to operations (e.g., a read operation, a program operation, and an erase operation) or operation periods of the planes 10-2, 10-4, 10-6, and 10-8, the ground voltage noise compensator 12-6 shown in FIG. 10 may operate to have the same compensated amount or different compensated amounts of the ground voltage noise according to the operations or operation periods of the planes 10-2, 10-4, 10-6, and 10-8. In addition, the driving voltage D3 may be generated more rapidly by increasing the bias current Ibias of the ground voltage noise compensator 12-6 shown in FIG. 10 and sizes of transistors. For example, the driving voltage D3 may be generated more rapidly by increasing the number or sizes of the seventh NMOS transistors N7-1 to N7-4 included in the first constant current source Iref1 and by increasing the numbers or sizes of the tenth NMOS transistors N10-1 to N10-4 and the eleventh NMOS transistors N11-1 to N11-4 included in the second constant current source Iref2.

FIG. 10 shows an example detailed configuration of the local reference voltage generator LVREFGA shown in FIG. 9. Although not shown, each of the local reference voltage generators LVREFGB, LVREFGC, and LVREFGD may have the same or similar detailed configuration as shown in FIG. 10. In this case, compensated amounts of ground voltage noises of the planes 10-2, 10-4, 10-6, and 10-8 may be differently adjusted by varying a code value of the second control signal con2 of each of the local reference voltage generators LVREFGA, LVREFGB, LVREFGC, and LVREFGD. For example, controllers (not shown) in the regions CONG shown in FIG. 4 may be configured to generate the same second control signal con2 or different second control signals con2 according to operations.

Figure 11:
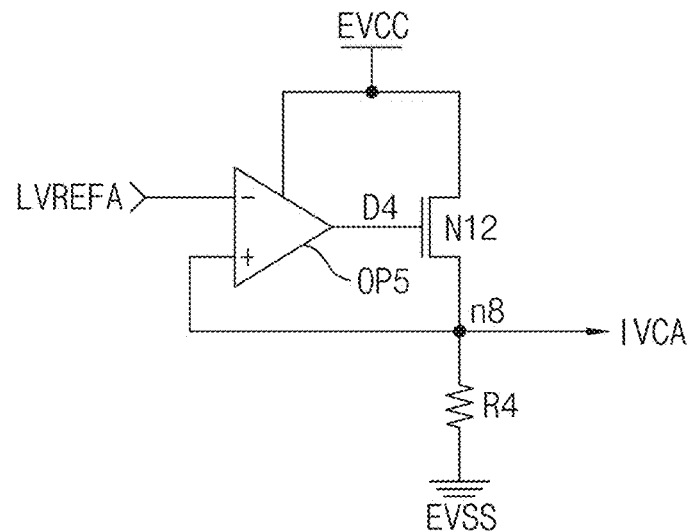
FIG. 11 is a circuit diagram showing an example configuration of an internal power supply voltage driver according to some example embodiments of some inventive concepts.

FIG. 11 is a circuit diagram showing an example configuration of an internal power supply voltage driver LIVCD according to some example embodiments of some inventive concepts. The internal power supply voltage driver LIVCD may include a fifth differential amplifier OP5, a twelfth NMOS transistor N12, and a fourth resistor R4.

Operations of the internal power supply voltage driver LIVCD shown in FIG. 11 will be described as follows.

The fifth differential amplifier OP5 may generate a fourth driving voltage D4 based on a difference between a local reference voltage LVREFA and an internal power supply voltage IVCA.

The twelfth NMOS transistor N12 may be turned on based on the fourth driving voltage D4, drive an external power supply voltage EVCC, and generate the internal power supply voltage IVCA.

That is, the internal power supply voltage driver LIVCD may generate the internal power supply voltage IVCA, which varies with a variation in level of the local reference voltage LVREFA.

Referring to FIGS. 4 and 11, when a large amount of current is consumed at an internal ground voltage node IVSSN in the plane 10-2, a level of the internal power supply voltage IVCA may greatly drop, and a level of the fourth driving voltage D4 may be greatly elevated so that the twelfth NMOS transistor N12 may operate to drive a larger amount of current. In this case, a large amount of current may flow through the fourth resistor R4 and thus, a voltage level of the internal ground voltage node IVSSN is elevated due to ground voltage noise. The internal ground voltage node IVSSN may be at a position which is at a distance from an external ground voltage terminal EVSSP to which an external ground voltage EVSS is applied and where a relatively large amount of current is consumed during an operation. For instance, the internal ground voltage node IVSSN may be at a distance from the external ground voltage terminal EVSSP in a region PB of a page buffer. Further, the internal ground voltage node IVSSN may be a node connected to the external ground voltage EVSS.

The internal power supply voltage driver LIVCD shown in FIG. 11 may show a configuration of one of a plurality of internal power supply voltage drivers LIVCD in the plane 10-2, and the remaining internal power supply voltage drivers LIVCD, which are not shown, may have the same or similar configuration. Similarly, each of a plurality of internal power supply voltage drivers LIVCD of the planes 10-4, 10-6, and 10-8, which are not shown, may have the same or similar configuration as in FIG. 11.

In some example embodiments such shown in FIGS. 1 to 11 according to some inventive concepts, a case in which each of the planes 10-2, 10-4, 10-6, and 10-8 includes one internal ground voltage node IVSSN and an internal ground voltage of the one internal ground voltage node IVSSN is detected to compensate for ground voltage noise has been described. However, although not shown, each of the planes 10-2, 10-4, 10-6, and 10-8 may include at least two internal ground voltage nodes, and internal ground voltages of the at least two internal ground voltage nodes may be detected to compensate for ground voltage noise.

Figure 12:
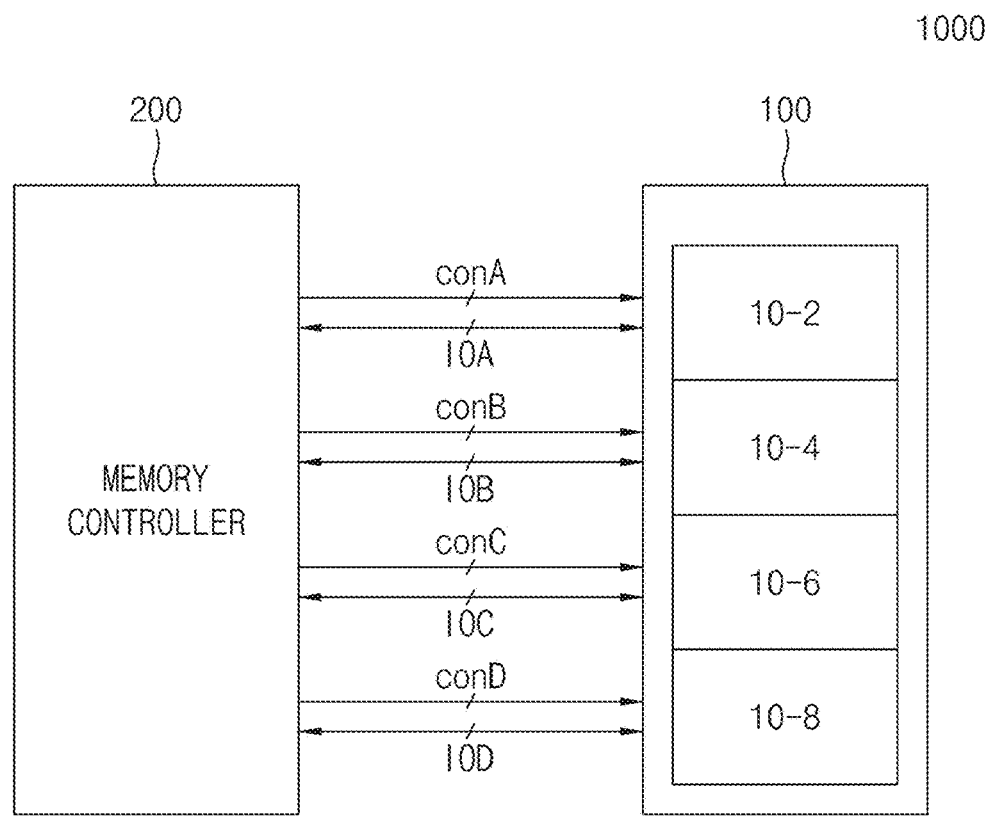
FIG. 12 is a block diagram showing an example memory system according to some example embodiments of some inventive concepts.

FIG. 12 is a block diagram showing an example memory system 1000 according to some example embodiments of some inventive concepts. The memory system 1000 may include a semiconductor memory device 100 and a memory controller 200. The semiconductor memory device 100 may include four planes 10-2, 10-4, 10-6, and 10-8. Further, the semiconductor memory device 100 may be a flash memory described with reference to FIGS. 1 to 11.

Referring to FIG. 12, the memory controller 200 may respectively apply control signals CONA, CONB, CONC, and COND to the planes 10-2, 10-4, 10-6, and 10-8 of the semiconductor memory device 100. Each of the control signals CONA, CONB, CONC, and COND may include control signals such as an address latch enable signal ALE, a command latch enable signal CLE, a read enable signal RE, a write enable signal WE, and the like. The planes 10-2, 10-4, 10-6, and 10-8 of the semiconductor memory device 100 may respectively transmit and receive input/output (I/O) data IOA, IOB, IOC, and IOD to and from the memory controller 200. Each of the I/O data IOA, IOB, IOC, and IOD may include an address, data, and a command. For example, the memory controller 200 may transmit the address as the I/O data IOA, IOB, IOC, and IOD based on the address latch enable signal ALE and transmit the command as the corresponding I/O data IOA, IOB, IOC, and IOD based on the command latch enable signal CLE. Further, the semiconductor memory device 100 may output data as the I/O data IOA, IOB, IOC, and IOD based on the read enable signal RE when a command applied from the memory controller 200 is a read command and receive the I/O data IOA, IOB, IOC, IOD as data when the command applied from the memory controller 200 is a program command.

The memory controller 200 may independently control each of the planes 10-2, 10-4, 10-6, and 10-8 of the semiconductor memory device 100. Thus, in some example embodiments, the planes 10-2, 10-4, 10-6, and 10-8 of the semiconductor memory device 100 may perform different operations in parallel. In this case, even if different ground voltage noises occur in the respective planes 10-2, 10-4, 10-6, and 10-8, the semiconductor memory device 100 according to some example embodiments of some inventive concepts may be configured to compensate for ground voltage noise occurring in a corresponding plane and generate an internal power supply voltage, thereby ensuring an internal power supply voltage margin. Thus, operation reliability of the semiconductor memory device 100 may be ensured.

An example embodiment in which the semiconductor memory device (i.e., a flash memory) according to some example embodiments of some inventive concepts includes four planes and each of the four planes includes a controller and is able to perform an independent operation has been described as an example. However, every two planes of the four planes may include one controller configured to control operations of the corresponding two planes.

In addition, the semiconductor memory device (i.e., a flash memory) according to some example embodiments of some inventive concepts may include one plane. In this case, the semiconductor memory device may be configured such that ground voltage noise may be detected from at least one internal ground voltage node in at least one position of the one plane, and an internal power supply voltage may be compensated for.

In the semiconductor memory device according to some example embodiments of some inventive concepts, the semiconductor memory device is a flash memory, and particularly, a NAND flash memory. In some example embodiments of some inventive concepts, the semiconductor memory device may be various kinds of flash memories including a NOR flash memory. Furthermore, some example embodiments of some inventive concepts may include memories such as dynamic random access memory (DRAM), resistive RAM (ReRAM), ferroelectric RAM (FeRAM), magnetic RAM (MRAM), phase-change RAM (PRAM), polymer RAM (PoRAM), and the like.

Some example embodiments presented herein, such as those shown in the Figures, may exhibit an example organization of components. Other example embodiments may include a different organization of components, such as renaming, rearranging, adding, partitioning, duplicating, merging, and/or removing components, sets of components, and relationships thereamong, without departing from the scope of the present disclosure. All such variations that are reasonably technically and logically possible, and that are not contradictory with other statements, are intended to be included in this disclosure, the scope of which is to be understood as being limited only by the claims.

According to some example embodiments of some inventive concepts, a semiconductor memory device and a memory system including the same may be capable of compensating for a margin between an internal power supply voltage and an internal ground voltage due to ground voltage noise. Accordingly, operation reliability of the semiconductor memory device and the memory system may be improved.

While some example embodiments of some inventive concepts have been described with reference to the accompanying drawings, it should be understood by those skilled in the art that various modifications may be made without departing from the scope of some inventive concepts and without changing essential features thereof. Therefore, the above-described example embodiments should be considered in a descriptive sense only and not for purposes of limitation.

What is claimed is:
1. A semiconductor memory device comprising:
    an external power supply voltage terminal configured to receive an external power supply voltage;
    an external ground voltage terminal configured to receive an external ground voltage;
    a ground voltage noise detector configured to detect a difference between the external ground voltage and an internal ground voltage of an internal ground voltage node and generate a ground voltage noise reference voltage;
    an internal power supply voltage reference voltage generator configured to generate an internal power supply voltage reference voltage based on the external power supply voltage and the ground voltage noise reference voltage; and
    an internal power supply voltage driver configured to generate an internal power supply voltage based on the internal power supply voltage reference voltage.
2. The semiconductor memory device of claim 1, wherein the internal ground voltage node is at a distance from the external ground voltage terminal and/or adjacent to a position in which a relatively large amount of current is consumed.

3. The semiconductor memory device of claim 1, wherein the ground voltage noise detector is adjacent to the external ground voltage terminal.

4. The semiconductor memory device of claim 1,
wherein the semiconductor memory device further comprises a number of planes configured to independently perform the same operation or different operations,
wherein the internal ground voltage node is in a corresponding peripheral circuit region of each of the planes, and
wherein the internal power supply voltage reference voltage generator further comprises:
a global reference voltage generator adjacent to the external power supply voltage terminal of a global peripheral circuit region and configured to generate a global reference voltage based on the external power supply voltage;
a local reference voltage generator in the corresponding peripheral circuit region of each of the planes and configured to generate a corresponding local reference voltage based on the global reference voltage and a corresponding ground voltage noise reference voltage; and
a number of internal power supply voltage drivers in the corresponding peripheral circuit region of each of the planes and configured to generate a corresponding internal power supply voltage based on the corresponding local reference voltage.

5. The semiconductor memory device of claim 4,
wherein the global peripheral circuit region is adjacent to the peripheral circuit regions of the planes, and
wherein the internal ground voltage node is at a distance from the external ground voltage terminal and/or adjacent to a position in which a relatively large amount of current is consumed.

6. The semiconductor memory device of claim 4, wherein the ground voltage noise detector is adjacent to the external ground voltage terminal in the global peripheral circuit region and further configured to,
detect a difference between the external ground voltage and a corresponding internal ground voltage of a corresponding internal ground voltage node of each of the planes, and
generate a corresponding ground voltage noise reference voltage.

7. The semiconductor memory device of claim 4, wherein the ground voltage noise detector further comprises:
a switch configured to transmit a precharge voltage to a precharge node based on a first control signal;
a capacitor connected between the precharge node and a corresponding internal ground voltage and configured to reflect a variation of a corresponding internal power supply voltage in the precharge voltage; and
a ground voltage noise reference voltage generator configured to generate a corresponding ground voltage noise reference voltage in which a variation of voltage of the precharge node is reflected based on the voltage of the precharge node and the corresponding ground voltage noise reference voltage.

8. The semiconductor memory device of claim 7, wherein the local reference voltage generator further comprises:

a first differential amplifier configured to generate a first sub-driving voltage based on a difference between the global reference voltage and the corresponding local reference voltage;
a second differential amplifier configured to generate a second sub-driving voltage based on a difference between the precharge voltage and the corresponding ground voltage noise reference voltage; and
a driver configured to generate a corresponding local reference voltage based on a driving voltage, wherein the driving voltage is based on the first sub-driving voltage and the second sub-driving voltage.

9. The semiconductor memory device of claim 8,
wherein the first differential amplifier further comprises:
a current mirror connected between the external power supply voltage and first and second nodes,
a first constant current source connected between a third node and the external ground voltage and configured to generate a first constant current based on a bias voltage, and
a first differential sensor connected between each of the first and second nodes and the third node and configured to sense a difference between the global reference voltage and the local reference voltage and generate the first sub-driving voltage, and
wherein the second differential amplifier further comprises,
the current mirror;
a second constant current source connected between a fourth node and the external ground voltage and configured to generate a second constant current based on the bias voltage; and
a second differential sensor connected between each of the first and second nodes and the fourth node and configured to sense a difference between the ground voltage noise reference voltage and the precharge voltage and generate the second sub-driving voltage.

10. The semiconductor memory device of claim 9, wherein the second constant current source is further configured to generate a second constant current that is smaller than the first constant current based on a second control signal.

11. A semiconductor memory device comprising:
a number of planes;
an internal ground voltage node in a corresponding peripheral circuit region of each of the planes;
an external power supply voltage terminal in a global peripheral circuit region adjacent to peripheral circuit regions of the planes and configured to receive an external power supply voltage;
an external ground voltage terminal in the global peripheral circuit region and configured to receive an external ground voltage;
a ground voltage noise detector adjacent to the external ground voltage terminal of the global peripheral circuit region and configured to detect a difference between the external ground voltage and an internal ground voltage of a corresponding internal ground voltage node of each of the planes and generate a corresponding ground voltage noise reference voltage;
a global reference voltage generator adjacent to the external power supply voltage terminal of the global peripheral circuit region and configured to generate a global reference voltage based on the external power supply voltage;
a local reference voltage generator in the corresponding peripheral circuit region of each of the planes and configured to generate a local reference voltage based on the global reference voltage and the corresponding ground voltage noise reference voltage; and a number of internal power supply voltage drivers in the corresponding peripheral circuit region of each of the planes and configured to generate a corresponding internal power supply voltage based on a corresponding local reference voltage.

12. The semiconductor memory device of claim 11,
wherein the semiconductor memory device is a flash memory, and
wherein each of the planes further comprises:
a memory cell array in a memory cell array region and comprising a plurality of blocks, wherein each of the plurality of blocks includes a string selection transistor, a plurality of floating gate transistors, and a ground selection transistor, which are connected in series between each of a plurality of bit lines and a common source line, a gate of the string selection transistor is connected to a string selection line, gates of the plurality of floating gate transistors are respectively connected to a plurality of word lines, and a gate of the ground selection transistor is connected to a ground selection line;
a row decoder in the corresponding peripheral circuit region and configured to decode a row address, select one of the plurality of blocks, and select one of a plurality of word lines in the selected block;
a page buffer decoder in the corresponding peripheral circuit region and configured to decode a column address and select one of a plurality of bit lines in the selected block;
a page buffer in the corresponding peripheral circuit region and configured to buffer data to be stored in selected memory cells of a corresponding memory cell array and/or data output from the selected memory cells;
a corresponding command and address generator in the corresponding peripheral circuit region and configured to receive a command and address from outside and generate a command signal, the row address, and the column address; and
a controller in the corresponding peripheral circuit region and configured to generate control signals indicating a corresponding command based on the command signal.

13. The semiconductor memory device of claim 12, wherein a corresponding internal ground voltage node of each of the planes is at a distance from the external ground voltage terminal in a region of the page buffer.

14. The semiconductor memory device of claim 12, wherein the corresponding local reference voltage generator of each of the planes is in a region of the row decoder or a region adjacent to the region of the row decoder, which is adjacent to a region of the page buffer decoder.

15. The semiconductor memory device of claim 14, wherein the number of internal power supply voltage drivers of each of the planes are respectively at different positions in the region of the page buffer decoder.

16. The semiconductor memory device of claim 11, wherein the ground voltage noise detector further comprises:

a switch configured to transmit a precharge voltage to a precharge node based on a first control signal;
a capacitor connected between the precharge node and a corresponding internal ground voltage and configured to reflect a variation of a corresponding internal power supply voltage in the precharge voltage; and
a ground voltage noise reference voltage generator configured to generate the corresponding ground voltage noise reference voltage, which reflects a variation of a voltage of the precharge node, based on the voltage of the precharge node and the corresponding ground voltage noise reference voltage,
wherein the controller is configured to generate the first control signal.

17. The semiconductor memory device of claim 16, wherein the local reference voltage generator further comprises:
a first differential amplifier configured to generate a first sub-driving voltage based on a difference between the global reference voltage and the corresponding local reference voltage;
a second differential amplifier configured to generate a second sub-driving voltage based on a difference between the precharge voltage and a corresponding ground voltage noise reference voltage; and
a driver configured to generate the corresponding local reference voltage based on a driving voltage, wherein the driving voltage is based on the first sub-driving voltage and the second sub-driving voltage.

18. The semiconductor memory device of claim 17, wherein the first differential amplifier further comprises:
a current mirror connected between the external power supply voltage and first and second nodes;
a first constant current source connected between a third node and the external ground voltage and configured to generate a first constant current based on a bias voltage; and
a first differential sensor connected between each of the first and second nodes and the third node and configured to sense a difference between the global reference voltage and the local reference voltage and generate the first sub-driving voltage, and the second differential amplifier further comprises:
the current mirror;
a second constant current source connected between a fourth node and the external ground voltage and configured to generate a second constant current based on the bias voltage; and
a second differential sensor connected between each of the first and second nodes and the fourth node and configured to sense a difference between the corresponding ground voltage noise reference voltage and the precharge voltage and generate the second sub-driving voltage.

19. The semiconductor memory device of claim 18, wherein the second constant current source is controlled such that the second constant current is smaller than the first constant current based on a second control signal,
wherein the controller is configured to generate the second control signal.

* * * * *